United States Patent [19]

Ganthier

[11] Patent Number: 5,076,794
[45] Date of Patent: Dec. 31, 1991

[54] SPACE-SAVING MOUNTING INTERCONNECTION BETWEEN ELECTRICAL COMPONENTS AND A PRINTED CIRCUIT BOARD

[75] Inventor: James J. Ganthier, Spring, Tex.
[73] Assignee: Compaq Computer Corporation, Houston, Tex.
[21] Appl. No.: 693,949
[22] Filed: Apr. 29, 1991
[51] Int. Cl.$^5$ .............................................. H01R 9/09
[52] U.S. Cl. ...................................... 439/70; 439/82; 439/246
[58] Field of Search ................................ 439/70-76, 439/79-82, 246-248, 263, 264, 330, 824, 876, 66

[56] References Cited

U.S. PATENT DOCUMENTS 4,854,882  8/1989  Corridori ............................ 439/246
4,961,709 10/1990  Noschese ............................. 439/82

Primary Examiner—Paula A. Bradley
Attorney, Agent, or Firm—Johnson & Gibbs

[57] ABSTRACT

The projecting underside connector portions on an electrical component are removably connected to surface mounted electrical contact points on one side of a printed circuit board using a specially designed interconnect device. The interconnect device includes a support board through which a spaced series of openings transversely extend, the openings being alignable with the component connector portions and the surface mounted contact points. Barrel portions of longitudinally resilient, electrically conductive connector pin members are anchored within the support board openings and have recessed first end portions positioned adjacent a first side of the support board and configured to removably receive and firmly hold the electrical component connector portions. Projecting outwardly beyond the second side of the support board are spring-loaded, longitudinally depressible second end portions of the connector pin members. To use the interconnect device, the electrical component connector portions are plugged into the open pin member barrel ends and peripheral portions of the support board are removably secured to the printed circuit board in a manner holding the second pin member end portions in longitudinally depressed engagement with the surface mounted electrical contact points. Compared to conventional "through-hole" component mounting methods, this interconnect method leaves the interior and opposite side surface portions of the circuit board beneath the mounted component free for additional circuitry for other components if desired.

16 Claims, 2 Drawing Sheets

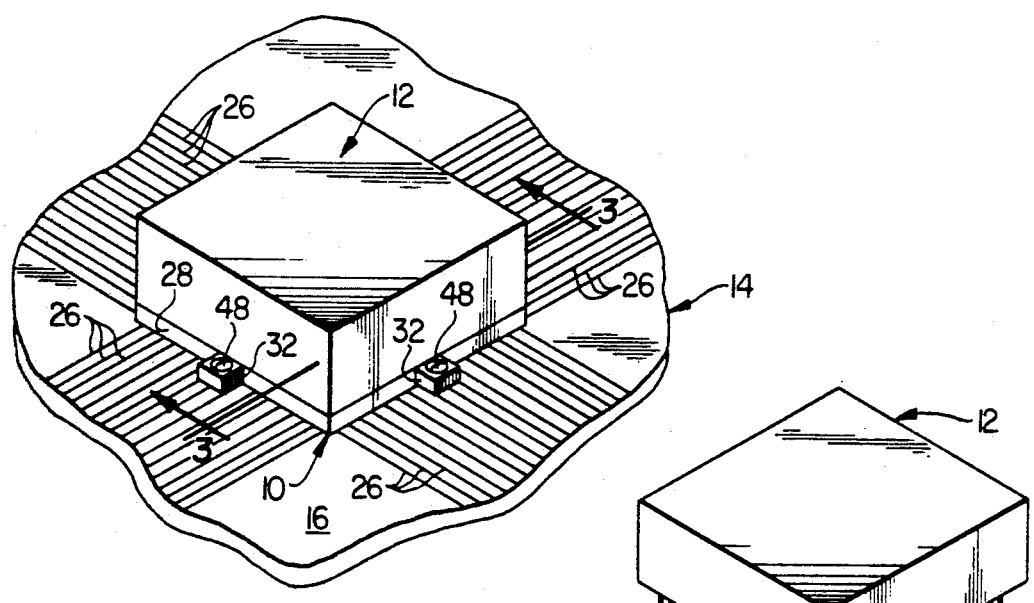
FIG. 1
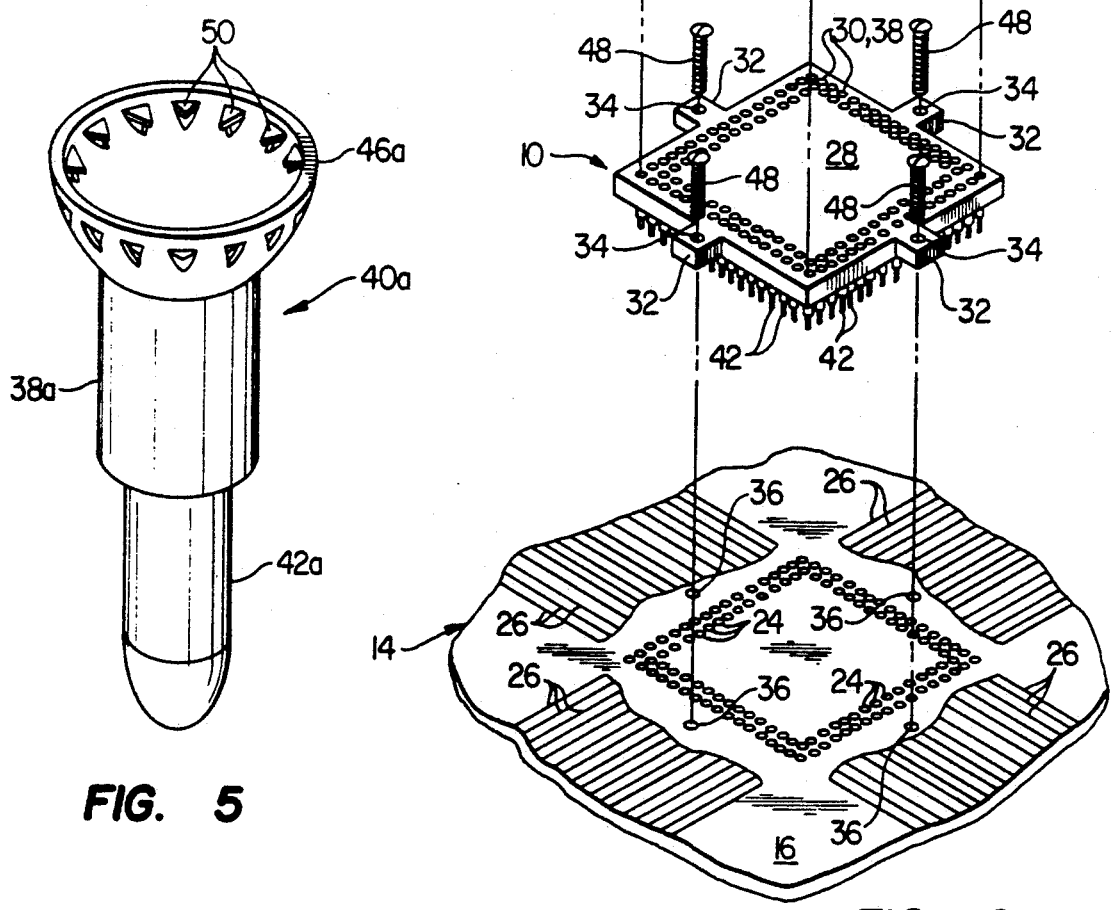
FIG. 5
FIG. 2

SPACE-SAVING MOUNTING INTERCONNECTION BETWEEN ELECTRICAL COMPONENTS AND A PRINTED CIRCUIT BOARD

BACKGROUND OF THE INVENTION

1. Field of the Invention

The present invention relates generally to printed circuit board apparatus, and more particularly relates to apparatus and methods for removably connecting electrical components, such as processors, to the circuitry of printed circuit boards.

2. Description of Related Art

Electrical components, such as processors, to be operatively mounted on one side of a printed circuit board are typically provided with a spaced series of connector pins projecting downwardly from their undersides. An electrical interface between these pins and appropriate circuit points on the board is typically provided by a spaced series of solder-lined "through-holes" formed through the circuit board, and an interconnect device comprising a support board (commonly referred to as a "housing") to which a spaced series of transverse connector pins are secured.

The interconnect device pins have hollow upper ends adapted to frictionally receive the electrical component connector pins, and lower end portions which project downwardly from the underside of the support board and are configured and arranged to be inserted into and frictionally retained within the circuit board through-holes. To operatively mount the electrical component on one side of the circuit board the component connector pins are simply plugged into the open upper ends of the interconnect device pins, and the lower ends of the interconnect device pins are plugged into the circuit board through-holes.

While this through-hole method of connecting an electrical component to a printed circuit board is conventional and widely accepted, it has a well known disadvantage relating to the printed circuit board space which it requires. Specifically, due to the necessity of forming a closely spaced multiplicity of circuit board through-holes directly beneath the electrical component, the entire volume of the circuit board within the "footprint" of the mounted component is effectively dedicated to that component, the through-holes preventing the routing of circuitry for other components along the component side of the circuit board, through its interior, or along its opposite side, beneath the mounted component. The through-holes also, of course, prevent the mounting of a second electrical component on the opposite circuit board side directly opposite the first mounted component.

As printed circuit boards become more complex, and the desirability of reducing their overall size continues to increase, this large circuit board volume and surface area requirement associated with conventional "through-hole" component mounting methods has become considerably less acceptable. It is accordingly an object of the present invention to provide an improved, more space-efficient connection method, and associated apparatus, for operatively mounting electrical components on printed circuit boards.

SUMMARY OF THE INVENTION

In carrying out principles of the present invention, in accordance with a preferred embodiment thereof, an electrical component, such as a processor, is connected to surface mounted electrical contact points on one side of a printed circuit board in a manner leaving the interior and opposite side surface portions of the circuit board beneath the mounted component free for additional circuitry for other components if desired. This unique space-saving mounting of an electrical component on a printed circuit board is accomplished in the present invention by utilizing a specially designed interconnect device which functions as an electrical interface between the electrical component and the surface mounted electrical contact points on the printed circuit board.

The interconnect device, in a preferred embodiment thereof, includes a support board or "housing" having a spaced series of openings extending transversely therethrough and being alignable with the circuit board contact points and with the projecting underside connector portions of the electric component to be operatively mounted on the printed circuit board. Barrel portions of longitudinally resilient, electrically conductive connector pin members are anchored within the support board openings and have recessed first end portions positioned adjacent a first side of the support board and configured to removably receive and firmly hold the electrical component connector portions.

In one illustrated embodiment of the invention, the electrical component connector portions are pin-shaped and the recessed first barrel end portions have cylindrical socket configurations. In a second illustrated embodiment of the invention, the electrical component connector portions are generally dome-shaped and the recessed first barrel end portions are generally cup-shaped, and provided with interior barbs, for complementarily receiving and holding the electrical component connector portions.

Projecting outwardly from the second ends of the connector pin barrel portions, and beyond the second side of the support board, are spring-loaded, longitudinally depressible second end portions of the connector pin members. To use the interconnect device, the electrical component connector portions are plugged into the pin member barrel ends and portions of the support board are removably secured to the printed circuit board, using suitable mechanical fastening members, in a manner holding the second pin member end portions in longitudinally depressed engagement with the surface mounted electrical contact points on the printed circuit board.

In this manner the electrical component may be easily and quickly mounted on the printed circuit board, and electrically connected to its circuitry, without the previous necessity of forming a multiplicity of interconnect pin "through-holes" through the circuit board beneath the component. The unique ability of the interconnect device of the present invention to be removably connected to surface contact points on a printed circuit board thus advantageously provides the opportunity to route additional printed circuitry through the interior and along the second side surface of the circuit board directly beneath an electrical component operatively mounted on its first side. It also permits the mounting of another electrical component on the second circuit board side surface, directly opposite from the first electrical component, if desired, and further permits additional printed circuitry (to and from other board-mounted components) to be routed along the first circuit board side surface, directly beneath the first electrical component. As an added benefit, the longitudinal resilience of the specially configured interconnect device pins automatically compensates for circuit board flexure without bending or otherwise damaging such pins.

BRIEF DESCRIPTION OF THE DRAWINGS

FIG. 1 is an assembled perspective view of a portion of printed circuit board to which a representative processor is connected utilizing a specially designed surface mountable interconnect device embodying principles of the present invention;

FIG. 2 is an exploded perspective view of the processor, interconnect device and printed circuit board portion shown in FIG. 1;

FIG. 5 is an enlarged scale perspective view of one of the specially designed, longitudinally resilient connection pin member portions of the FIG. 4 interconnect device.

DETAILED DESCRIPTION

Figure 3:
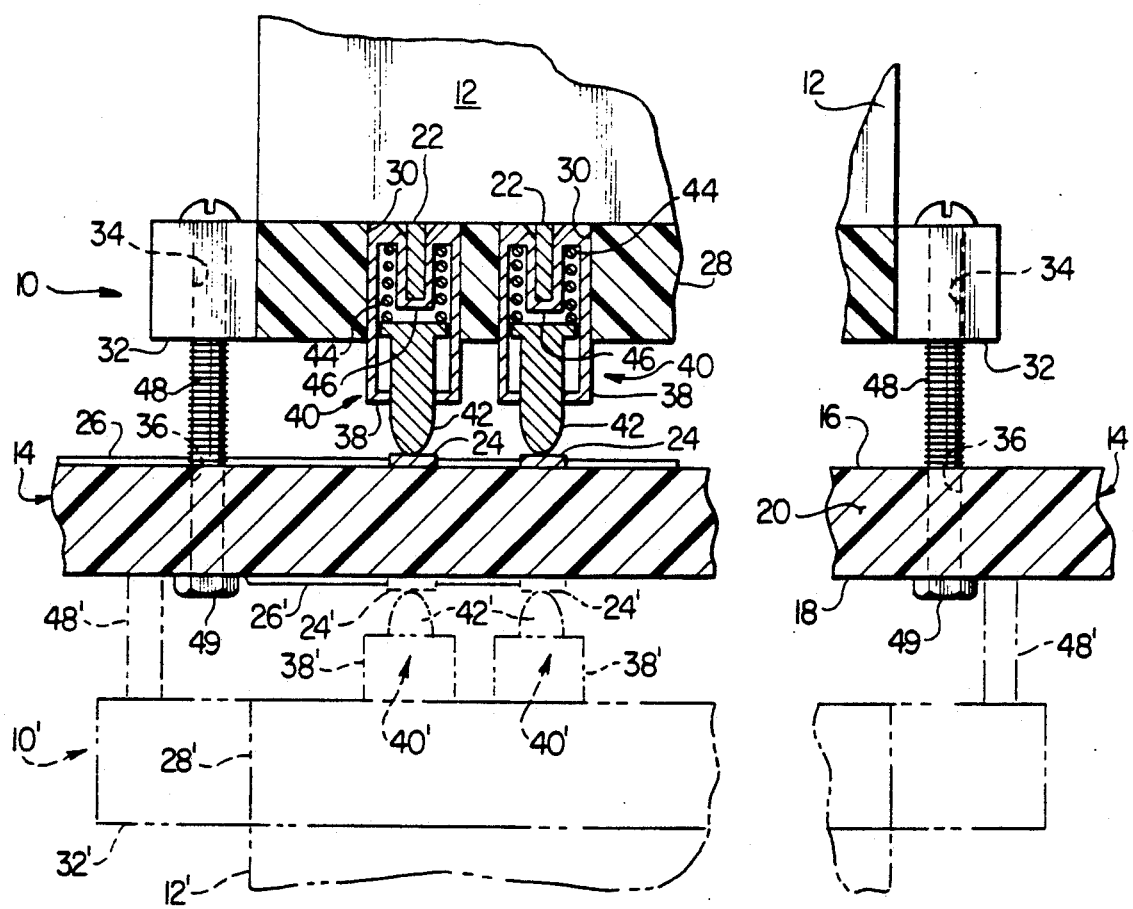
FIG. 3 is an enlarged scale fragmentary cross-sectional view taken through the assembled printed circuit board apparatus along line 3—3 of FIG. 1, and additionally illustrating, in phantom, another processor and interconnect device mounted directly beneath the FIG. 1 processor and interconnect device on the opposite side of the printed circuit board.

Referring initially to FIGS. 1-3, the present invention provides a uniquely constructed interconnect device 10 which is utilized to operatively mount an electrical component, such as a processor 12, on the illustrated portion of a printed circuit board 14 having a top side 16, a bottom side 18, and an interior volume 20 disposed between its top and bottom sides. The processor 12 has a spaced series of electrically conductive connector pins 22 which project downwardly from its underside and are alignable with a spaced series of surface mounted electrical contact areas 24 disposed on the top side 16 of the printed circuit board and operatively connected to the indicated series of printed circuit leads 26 incorporated in the usual manner on the top side of board 14.

The representatively illustrated printed circuit board 14 is of a conventional construction, having a fiberglass resin/copper substrate portion with the usual etched copper circuitry associated therewith. However, as used herein, the term "printed circuit board" or the like is intended to encompass printed circuit boards of other constructions such as, for example, "hybrid" boards having ceramic substrate portions with pasted palladium silver or copper circuitry.

The interconnect device 10 includes a support board 28 (commonly referred to in the connector art as a "housing") having a spaced series of small circular openings 30 extending transversely therethrough and being alignable with the surface mounted electrical contact areas 24 and the electrical component connector pins 22. Like the processor 12, the support board 28 has a rectangular configuration, although it will be readily appreciated that the processor and support board could have a variety of other shapes. For purposes later described, four small connection tabs 32 project outwardly from the side edges of the support board 28 and have circular openings 34 formed therethrough and alignable with circular openings 36 formed through the printed circuit board 14 between adjacent pairs of printed circuit leads 26.

Barrel portions 38 of specially designed electrically conductive, longitudinally resilient connector pins 40 are suitably anchored within the support board openings 30, and lower end portions 42 of the pins 40 axially project downwardly beyond the underside of the support board 28. The lower pin end portions 42 are telescoped into the open lower ends of the barrel portions 38 and are resiliently biased toward lower limit positions relative to the barrel portions by cylindrical coil spring members 44 captively retained within barrel portions 38. Recess are defined in the upper ends of barrel portions 38 by downwardly extending cylindrical socket structures 46 sized to removably receive and frictionally retain therein the processor connector pins 22.

As best illustrated in FIG. 3, the processor 12 is operatively mounted on the printed circuit board 14 by inserting the processor connector pins 22 into the pin member barrel sockets 46. Mechanical fastening members, such as the illustrated mounting bolts 48, are then passed downwardly through the connection tab openings 34 and through the board openings 36, and secured to suitable fastening nuts 49 (FIG. 3) on the underside of the board. The passage of bolts 48 through the circuit board openings 36 automatically aligns the lower pin end portions 42 with the underlying electrical contact areas 24 on the printed circuit board 14. Tightening of the nuts 49 onto the bolts 48 brings the interconnect device 10 and the processor 12 downwardly to their operatively mounted position in which the lower pin end portion 42 engage their associated electrical contact areas 24 and are longitudinally depressed, through a portion of their overall available stroke, upwardly into barrel portions 38 against the yieldable resistance of springs 44.

This unique surface mounting of the processor 12 on one side of the printed circuit board 14 provides an important advantage, namely a considerable savings in usable circuit board space taken up by the mounted electrical component, over conventional component mounting techniques in which rigid interconnect device pins are inserted in solder lined through-holes extending transversely through the printed circuit board. Specifically, as can be clearly seen in FIG. 3, the illustrated mounting of processor 12 on the top side 16 of the circuit board 14 does not create an encroachment (except for the four small retention holes 36) into the interior volume 20, or onto the circuit board bottom side 18, of the circuit board within the vertical "footprint" of the electrical component operatively mounted thereon utilizing the specially designed interconnect device 10 of the present invention.

Such lack of interior and opposite side circuit board space encroachment advantageously frees up the interior and opposite side surface component footprint regions of the circuit board for routing therethrough and thereon of printed circuitry to and from other components mounted on the printed circuit board. Moreover, because the surface mounted electrical contact areas 24 occupy significantly less board surface space than their conventional through-hole counterparts, additional printed circuitry (to other electrical components on the circuit board) may, in many cases, be run along the top board surface 16 directly beneath the mounted processor 12 if desired.

The absence of connector pin through-holes beneath the processor 12 also advantageously permits another electrical component to be operatively mounted on the bottom side 18 of the circuit board 14 directly beneath an electrical component mounted on the top side 16 of the circuit board. For example, as shown in phantom in FIG. 3, a second processor 12' could be mounted directly beneath the processor 12 utilizing a second interconnect device 10', surface mounted electrical contact areas 24' and associated printed circuitry 26' on the bottom side 18 of the circuit board 14, and mounting screws 48' or other mechanical fastening devices.

As can be seen from the foregoing, compared to conventional through-hole component mounting methods the use of the improved interconnect device 10, coupled with the use of the surface-mounted electrical contact areas 24, dramatically increases the number of electrical components which may be operatively mounted on a printed circuit board of a given size. Additionally, considerably greater circuitry routing space is preserved which easily accommodates the increased number of mounted components.

Other desirable advantages are also provided by the use of the improved interconnect device 10. For example, the longitudinal resiliency of the specially configured support board pins 40 automatically compensates for circuit board flexure or warpage during use without bending or otherwise damaging the pins. This feature, in turn, reduces component replacement costs since there is significantly less chance of damaging the components during their removal from the printed circuit board. Additionally, the components are considerably more easily and quickly removable from the printed circuit board.

Figure 4:
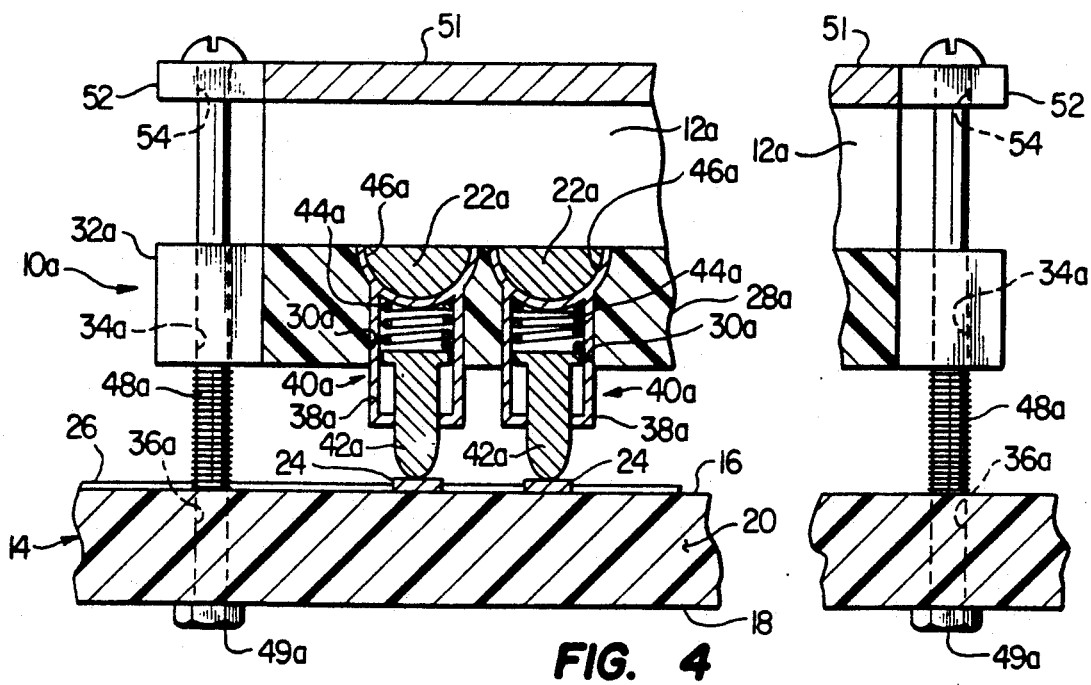
FIG. 4 is an enlarged scale fragmentary cross-sectional view, similar to that shown in FIG. 3, through an alternate embodiment of the assembled processor/interconnect device structure shown in FIG. 1.

Shown in FIG. 4 is an alternate embodiment $10_a$ of the interconnect device 10. The modified interconnect device $10_a$ is used to conductively connect an electrical component, such as the illustrated processor $12_a$, to the surface-mounted contact areas 24 on the circuit board 14 when the underside connector projections $22_a$ of the component are generally dome-shaped instead of being generally pin-shaped as in the case of the previously described processor connector pins 22. With the exceptions noted below, the components in device $10_a$ are similar to those in device 10 and are accordingly given identical reference numerals, with the subscript "a", for ease in comparison.

To accommodate the generally dome-shaped underside connector portions $22_a$ of processor $12_a$, the recessed upper ends $46_a$ of the support board pins $40_a$ are generally cup-shaped and are configured and sized to complementarily receive the processor connector projections $22_a$. As shown in FIG. 5, suitable V-shaped slits are made around the periphery of the upper pin ends $46_a$ to form triangular barbs 50 which are pushed inwardly and function to firmly grip the projections $22_a$ pushed into the recessed pin ends $46_a$.

The interconnect device $10_a$ is removably secured to the circuit board 14 in a very secure manner utilizing a lock plate member 51 which is positioned over and engages the top side of the processor $12_a$, with side tab portions 52 of the lock plate overlying the connection tabs $32_a$ of the interconnect device $10_a$. As illustrated, the tabs 52 have openings 54 therein which are alignable with the device tab openings $34_a$. With the lock plate in place on top of the precessor $12_a$, the bolts $48_a$ are passed downwardly through the tab and board openings 54, $34_a$, $36_a$ and tightened into fastening nuts $49_a$ on the bottom of the board 14 to engage and longitudinally depress the lower pin end portions $42_a$ against the surface-mounted electrical contact areas 24.

If desired, the lock plate 51 could be deleted, and shorter bolts $48_a$ could be used to directly connect the device tabs $32_a$ to the board in a manner similar to that shown in FIG. 3. Additionally, if desired, a lock plate structure similar to plate 51 could be used in conjunction with processor 12 (FIG. 3) using longer bolts 48.

The foregoing detailed description is to be clearly understood as being given by way of illustration and example only, the spirit and scope of the present invention being limited solely by the appended claims.

What is claimed is:

1. Interconnect apparatus for operatively mounting an electrical component on a printed circuit board having a spaced series of surface mounted electrical contact areas on a side thereof, said electrical component having a spaced series of electrically conductive projections disposed thereon and alignable with said electrical contact areas, said interconnect apparatus comprising:

a support board having a spaced series of openings extending transversely therethrough and alignable with said electrically conductive projections;

a spaced series of electrically conductive pin members having barrel portions anchored in said openings, and spring-loaded, longitudinally depressible outer end portions telescopingly associated with said barrel portions and axially projecting outwardly beyond one side of said support board, said barrel portions having recessed outer ends disposed adjacent the opposite side of said support board and configured to removably receive and firmly hold said electrically conductive projections; and means for removably securing said support board to said printed circuit board in a manner holding and longitudinally depressing said pin member outer end portions against said electrical contact areas.

2. The interconnect apparatus of claim 1 wherein:
said electrically conductive projections are generally pin-shaped, and
said recessed outer ends of said barrel portions are generally socket-shaped.

3. The interconnect apparatus of claim 1 wherein:
said electrically conductive projections are generally dome-shaped, and
said recessed outer ends of said barrel portions are generally cup-shaped.

4. The interconnect apparatus of claim 3 wherein:
said recessed outer ends of said barrel portions are provided with inwardly projecting barb portions for facilitating the holding and electrical contact of said electrically conductive projections in said recessed outer ends of said barrel portions.

5. The interconnect apparatus of claim 1 wherein said means for removably securing include:
connection tab portions formed on the periphery of said support board, and
mechanical fastener means for removably securing said connection tab portions to said printed circuit board.

6. The interconnect apparatus of claim 5 wherein said means for removably securing further include a lock plate member positionable against an outer side portion of the component, and said mechanical fastener means are operative to interconnect said lock plate member, said connection tab portions, and said printed circuit board, and to draw said lock plate member toward said printed circuit board to cause said pin member outer end portions to be longitudinally depressed against said electrical contact areas.

7. Printed circuit apparatus comprising:
   a printed circuit board having a side surface with a spaced series of surface mounted electrical contact areas thereon;
   an electrical component having an underside with a spaced series of electrically conductive projections disposed thereon and alignable with said electrical contact areas; and
   electrical interconnect means for electrically connecting said electrical component projections to said surface mounted electrical contact areas, including:
      a support board having a spaced series of openings extending transversely therethrough and alignable with said electrically conductive projections,
      a spaced series of electrically conductive pin members having barrel portions anchored in said openings, and spring-loaded, longitudinally depressible outer end portions telescoped within said barrel portions and axially projecting outwardly beyond one side of said support board, said barrel portions having recessed outer ends disposed adjacent the opposite side of said support board and configured to removably receive and firmly hold said electrically conductive projections, and
   means for removably securing said support board to said printed circuit board in a manner holding and longitudinally depressing said pin member outer end portions against said electrical contact areas.

8. The printed circuit apparatus of claim 7 wherein:
   said electrically conductive projections are generally pin-shaped, and
   said recessed outer ends of said barrel portions are generally socket-shaped.

9. The printed circuit apparatus of claim 7 wherein:
   said electrically conductive projections are generally dome-shaped, and
   said recessed outer ends of said barrel portions are generally cup-shaped.

10. The printed circuit apparatus of claim 9 wherein:
    said recessed outer ends of said barrel portions are provided with inwardly projecting barb portions for facilitating the holding of said electrically conductive projections in said recessed outer ends of said barrel portions.

11. The printed circuit apparatus of claim 7 wherein said means for removably securing include:
    connection tab portions formed on the periphery of said support board, and
    mechanical fastener means for removably securing said connection tab portions to said printed circuit board.

12. The printed circuit apparatus of claim 11 wherein said means for removably securing further include a lock plate member positionable against an outer side portion of the component, and said mechanical fastener means are operative to interconnect said lock plate member, said connection tab portions, and said printed circuit board, and to draw said lock plate member toward said printed circuit board to cause said pin member outer end portions to be longitudinally depressed against said electrical contact areas.

13. A method of operatively mounting an electrical component on a printed circuit board having a spaced series of surface mounted electrical contact areas on a side thereof, said electrical component having a spaced series of electrically conductive projections disposed thereon and alignable with said electrical contact areas, said method comprising the steps of:
    supporting a series of electrically conductive pin members in a laterally spaced apart, longitudinally aligned parallel relationship in which the supported pin members are alignable with said electrically conductive projections, each of said pin members including:
       a barrel portion having a recessed first end configured to removably receive and firmly hold one of said electrically conductive projections, and a second end, and
       a spring-loaded, longitudinally depressible outer end portion telescoped within and axially projecting outwardly from said second end of said barrel portion;
    inserting said electrically conductive projections into said recessed first ends of said barrel portions; and
    holding said pin member outer end portions, in longitudinally depressed orientations thereof, against said surface mounted electrical contact areas on said printed circuit board.

14. The method of claim 13 wherein said supporting step is performed by:
    providing a support board having a spaced series of openings extending therethrough, and
    anchoring said barrel portions within said openings.

15. The method of claim 14 wherein said holding step is performed by removably securing said support board to said printed circuit board.

16. The method of claim 15 wherein said removably securing step includes the steps of:
    forming connection tab portions on the periphery of said support board, and
    utilizing mechanical fastener members to removably secure said connection tab portions to said printed circuit board.

* * * * *